United States Patent [19]

Hayashi et al.

[11] Patent Number: 4,792,838
[45] Date of Patent: Dec. 20, 1988

[54] GATE TURN-OFF THYRISTOR

[75] Inventors: Yasuhide Hayashi, Yokohama; Kouki Matsuse, Tama; Yoshisuke Takita, Tokyo, all of Japan

[73] Assignee: Kabushiki Kaisha Meidensha, Tokyo, Japan

[21] Appl. No.: 83,706

[22] Filed: Aug. 7, 1987

Related U.S. Application Data

[63] Continuation of Ser. No. 749,206, Jun. 27, 1985, abandoned.

[30] Foreign Application Priority Data

Jul. 16, 1984 [JP] Japan ................. 59-147093

[51] Int. Cl.[4] ............ H01L 29/74; H03K 5/13; H03K 17/60
[52] U.S. Cl. ................. 357/38; 307/604; 307/571
[58] Field of Search ........... 357/38, 38 G; 307/633, 307/604, 252 C

[56] References Cited

U.S. PATENT DOCUMENTS 4,092,703 5/1978 Sueoka et al. .......... 357/38
4,345,266 8/1982 Owyang ............... 357/38

Primary Examiner—Martin H. Edlow
Assistant Examiner—Robert P. Limanek
Attorney, Agent, or Firm—Bachman & La Pointe, P.C.

[57] ABSTRACT

In a gate turn-off thyristor including two separate gate electrodes, a first turn-off gate signal is applied to the first gate electrode and then a second turn-off gate signal is applied to the second gate electrode after a predetermined time has elapsed in order to improve the controllable anode current and to improve the capability against an anode-voltage rising rate. This is because the flow distribution of the anode current is unbalanced asymmetrical with respect to the structural center of the GTO and therefore the internal resistance between the cathode K and the second gate $G_2$ is reduced, so that it is possible to increase the magnitude of the turn-off gate current near the time when the anode current drops sharply or at the end of the GTO switching off operation.

8 Claims, 4 Drawing Sheets

TURN-ON

STORAGE

FALL

TURN-ON

STORAGE

FALL

GATE TURN-OFF THYRISTOR

This is a Continuation, of application Ser. No. 749,206 filed June 27, 1985, now abandoned.

BACKGROUND OF THE INVENTION

1. Field of the Invention

The present invention relates generally to a gate turn-off thyristor suitable for stably turning off a large anode current at high speed and more specifically to a thyristor turning-off gate controlling circuit connected to the gate turn-off thyristor.

2. Description of the Prior Art

As is well-known, gate turn-off thyristors (referred to as GTO thyristors hereinafter) have widely been used in various power electronic fields in place of ordinary thyristors. This is because the GTO thyristors can be turned off without use of any circuits including at least one conductor. Additionally, the GTO thyristor is high in efficiency and small in size, and further can control a high voltage and a large current as an excellent switching element. By the way, one of the important characteristics required for a GTO thyristor is the magnitude of controllable anode current which can be turned on or off in response to gate signals. In particular, once the GTO thyristor fails in the turning-off operation, since there always exists a danger that the GTO is destroyed, it is desirable that the controllable anode current is as large as possible.

However, the magnitude of the controllable anode current is affected by the internal and external conditions of the GTO thyristor. For instance, in the case where a Snubber circuit (surge voltage absorption circuit) connected in parallel with the GTO thyristor includes a small capacitance, the anode voltage rises sharply at high rising rate ($dV_A/dt$) when the GTO is being turned off, thereby resulting in turn-off failure or GTO thyristor destruction. On the other hand, in the case where the Snubber circuit includes a large stray inductance between wires, a high surge voltage is inevitably superimposed upon the anode voltage, thereby resulting in turn-off failure or GTO thyristor destruction. Therefore, there exists another problem such that the capacitance and the inductance of the Snubber circuit should be restricted, whenever a large anode current is turned off.

A more detailed description of the prior-art GTO thyristor will be made with reference to the attached drawings under DETAILED DESCRIPTION OF THE PREFERRED EMBODIMENTS.

SUMMARY OF THE INVENTION

With these problems in mind, therefore, it is the primary object of the present invention to provide a gate turn-off thyristor which can increase the magnitude of controllable anode current and also the magnitude of capability against anode voltage rising rate $dV_A/dt$, in particular, when the gate turn-off thyristor is turned off.

To achieve the above-mentioned object, in a gate turn-off thyristor according to the present invention having an anode electrode, a cathode electrode and two first and second gate electrodes arranged substantially symmetrical with respect to the cathode electrode, a first turning-off gate signal is first applied to the first gate electrode and then a second turning-off gate signal is applied to the second gate electrode a predetermined time period after the first turning-off gate signal has been applied to the first gate electrode, near a time point when anode current begins to drop sharply.

A turning-off gate driving circuit incorporated with the gate turn-off thyristor according to the present invention comprises, in particular, means for first applying a turning-off gate voltage to a first gate electrode and then to a second gate electrode after a predetermined delay time. The delay time can be fixed or adjusted according to the magnitude of anode current or on the basis of voltage difference between the first gate electrode and the second gate electrode.

BRIEF DESCRIPTION OF THE DRAWINGS

The features and advantages of the GTO thyristor according to the present invention over the prior-art GTO thyristor will be more clearly appreciated from the following description of the preferred embodiments of the invention taken in conjunction with the accompanying drawings in which like reference symbols or numerals designate the same or similar portions or sections throughout the figure thereof and in which:

FIG. 2(a) is a diagrammatic lateral cross-sectional view of the prior-art GTO thyristor, in which the crosshatched portion indicates an anode current path wide rectangular in cross section which is obtained when the GTO thyristor is kept on in steady state;

FIG. 2(b) is a longitudinal cross-sectional view of the prior-art GTO thyristor, in which the plural arrows indicate an anode current path wide rectangular in cross section which is obtained when the GTO thyristor is kept on in steady state;

FIG. 3(a) is a view similar to FIG. 2(a), in which the crosshatched portion indicates an anode current path narrow rectangular in cross section which is obtained immediately after the GTO thyristor has been turned off or during storage period;

FIG. 3(b) is a view similar to FIG. 2(b), in which the thick arrow indicates an anode current path narrow rectangular in cross section which is obtained during the storage period;

FIG. 4(a) is a view similar to FIG. 2(a), in which the small oval crosshatched portion indicates an anode current path small oval in cross section which is obtained after the GTO thyristor has been turned off or during fall period;

FIG. 4(b) is a view similar to FIG. 2(b), in which the thick arrow indicates an anode current path small oval in cross section which is obtained during the fall period;

FIG. 6(a) is a diagrammatic lateral cross-sectional view of the GTO according to the present invention, in which the crosshatched portion indicates an anode current path wide rectangular in cross section which is obtained when the GTO thyristor is kept on in steady state;

FIG. 6(b) is a longitudinal cross-sectional view of the GTO thyristor according to the present invention, in which the plural arrow indicates an anode current path wide rectangular in cross section which is obtained when the GTO thyristor is kept on in steady state;

FIG. 7(a) is a view similar to FIG. 6(a), in which the crosshatched portion indicates an anode current path narrow rectangular in cross section which is shifted to near the cathode edge immediately after the GTO thyristor has been turned off or during storage period;

FIG. 7(b) is a view similar to FIG. 6(b), in which the thick arrow indicates an anode current path narrow rectangular in cross section which is shifted during the storage period;

FIG. 8(a) is a view similar to FIG. 6(a), in which the small oval crosshatched portion indicates an anode current path small oval in cross section which is shifted to near the cathode electrode edge and at the middle portion thereof after the GTO thyristor has been turned off or during fall period;

FIG. 8(b) is a view similar to FIG. 6(b), in which the thick arrow indicates an anode current path small oval in cross section which is obtained during the fall period;

DETAILED DESCRIPTION OF THE PREFERRED EMBODIMENTS

To facilitate understanding of the present invention, a brief reference will be made to a prior-art GTO thyristor, with reference to the attached drawings.

Figure 1:
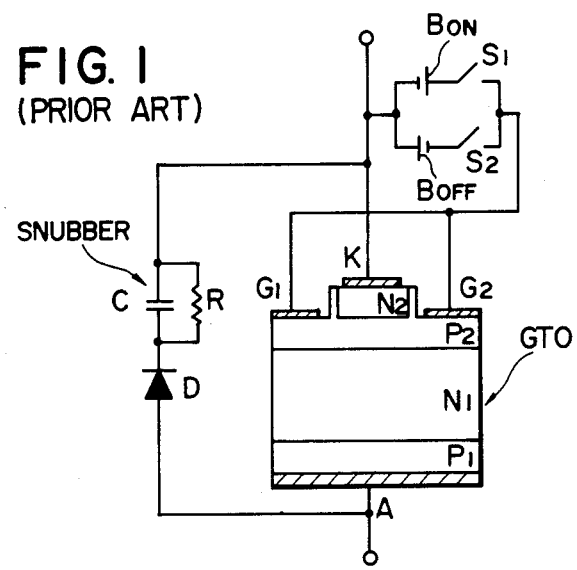
FIG. 1 is a diagrammatic view showing a structure and configuration of a prior-art GTO thyristor including a thyristor turning on/off gate driving circuit and a Snubber circuit.

FIG. 1 is a diagrammatical cross-sectional view and an external circuit of a typical rectangular prior-art GTO thyristor including four PNPN semiconductor layers. The GTO includes an anode electrode A, a cathode electrode K, and a pair of gate electrodes $G_1$ and $G_2$. The four PNPN semiconductor layers are a first P-type layer $P_1$ formed in contact with the anode electrode A, a first N-type layer $N_1$ formed adjoining to the first P-type layer $P_1$, a second P-type layer $P_2$ formed adjoining to the first N-type layer $N_1$ and in contact with the gate electrodes $G_1$ and $G_2$, and a second N-type layer $N_2$ formed in the second P-type layer $P_2$ and in contact with the cathode electrode K.

In FIG. 1, the GTO thyristor can be turned on or off by the aid of an external gate driving circuit including two, GTO turning-on and GTO turning-off, voltage supplies $B_{on}$ and $B_{off}$ and two, first and second, switches $S_1$ and $S_2$.

The negative terminal of the GTO turn-on voltage supply $B_{on}$ and the positive terminal of the GTO turn-off voltage supply $B_{off}$ are both connected in common to the cathode electrode K. The positive terminal of the GTO turn-on voltage supply $B_{on}$ and the negative terminal of the GTO turning-off voltage supply $B_{off}$ are both connected in common to the pair of gate electrodes $G_1$ and $G_2$ directly through the first and second switches $S_1$ and $S_2$, respectively. The above switches $S_1$ and $S_2$ are semiconductor switching elements, for instance, such as transistor, thyristor, field effect transistor, etc.

Further in FIG. 1, a snubber circuit is connected in parallel with the GTO thyristor in order to suppress surge voltages or spike voltages inevitably generated whenever the GTO thyristor is turned off. The circuit includes a diode D, a capacitor C, and a resistor R, which are all connected as shown.

The turning-on and turning-off operations of the GTO thyristor will be described hereinbelow. When the first switch $S_1$ is closed, the turning-on voltage $B_{on}$ is applied to turn on the GTO between the gate electrodes $G_1$ and $G_2$ and the cathode electrode K (G: positive, K: negative) under the condition that a forward bias voltage is applied between the anode electrode A and the cathode electrode K. Therefore, a gate current flows from the gate electrodes $G_1$ and $G_2$ to the cathode electrode K on both the sides of the cathode electrode K by way of the second P-type layer $P_2$ and the second N-type layer $N_2$. Since electrons flow from the cathode electrode K to the electrodes $G_1$ and $G_2$, some electrons transfer from the cathode electrode K to the anode electrode A by way of the second N-type layer $N_2$, the second P-type layer $P_2$, the first N-type layer $N_1$ and the first P-type layer $P_1$, so that the GTO is turned on.

In contrast with this, when the first switch $S_1$ is opened and the second switch $S_2$ is closed, the gate turning-off voltage $B_{off}$ is applied to turn off the GTO between the gate electrodes $G_1$ and $G_2$ and the cathode electrode K (G: negative; K: positive) under the condition that an anode current is flowing from the anode electrode A to the cathode electrode K. Therefore, a reverse gate current flows from the cathode electrode K to the gate electrodes $G_1$ and $G_2$ on both the sides of the cathode K by way of the second N-type layer $N_2$ and the second P-type layer $P_2$. Since electrons flows from the gate electrode G to the cathode electrode K, electrons flowing from the cathode electrode K to the anode electrode A are reduced, so that the GTO is turned off.

FIGS. 2(a), 2(b), 3(a), 3(b), and 4(a) and 4(b) show changes in the cross section of anode current path when the prior-art GTO thyristor shown in FIG. 1 is turned off.

Figure 2A:
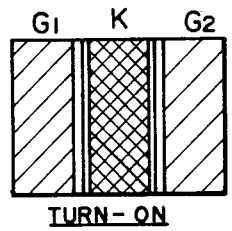
FIG. 2(a), 2(b), FIGS. 3(a), 3(b), and FIGS. 4(a), 4(b) show illustrations for assitance in explaining changes in anode current paths when the prior-art GTO thyristor is turned off.
Figure 2B:
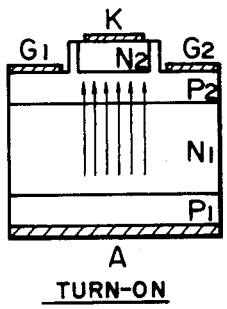

FIGS. 2(a) and 2(b) show a state where the GTO is kept turned on. As depicted in the drawings, the anode current flow spreading throughout the second N-type layer $N_2$ or the cathode electrode K in a wide rectangular state in cross section.

Figure 3A:
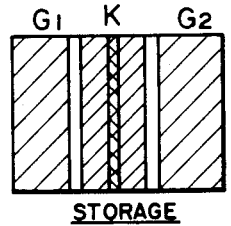
Figure 3B:
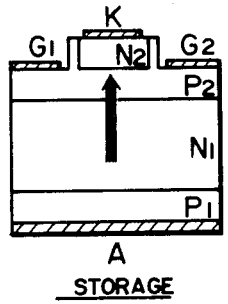

FIGS. 3(a) and 3(b) show a state immediately after the GTO has been turned off. As depicted in the drawings, the anode current flows being restricted to the middle of the cathode electrode K in a narrow rectangular state in cross section. This first transient state is called storage time period. This storage period is relatively short when a relatively small anode current is turned off, but long when a large anode current is turned off. That is to say, the larger the anode current, the longer the storage time period.

Figure 4A:
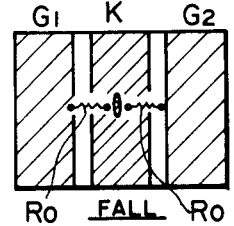
Figure 4B:
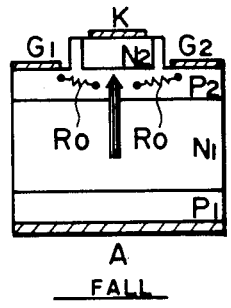

FIGS. 4(a) and 4(b) show a state immediately before the GTO will completely be turned off. As depicted in the drawings, the anode current flows being further restricted to the center of the cathode electrode K in a small oval state in cross section. This second transient state is called fall time period. The reason why the anode current concentrates on the middle or central portion of the cathode electrode K is that the negative GTO turning-off gate voltage is applied to the two separate gate electrodes $G_1$ and $G_2$ simultaneously, symmetrically and equally.

In this fall period, since the anode current is strictly restricted in cross-sectional area, if this period continues long, there exists a danger that the GTO is destroyed because of a great local power loss in turn-off operation. In this state, additionally, since the internal resistance $R_o$ in the second P-type layer $P_2$ between the gate electrodes $G_1$, $G_2$ and the cathode electrode K is high, it is impossible to effectively draw carriers from the first or second gate electrode $G_1$ or $G_2$ to the cathode electrode K, that is, to effectively pass a large gate current therebetween to reduce the fall time period. If this fall period is long and simultaneously the anode voltage rising rate is great, the turning-off power loss increases, resulting in GTO destruction.

In the GTO as described above, one of the important factors is a controllable anode current which can be turned off by applying a gate signal between the cathode electrode K and the gate electrodes $G_1$, $G_2$. It is preferable that the controllable anode current is as large as possible and is switched at high speed.

However, the controllable anode current is subjected to the influence of internal conditions and external conditions of the GTO. The internal conditions are the widths or sizes of the second N-type layer $N_2$, the cathode electrode K, the lifetime of minority carrier within the semiconductor layers, etc. The external conditions are the capacitance and stray inductance of the Snubber circuit, turning-on or turning-off gate voltage, etc. For instance, where the capacitance of the Snubber circuit is excessively small, since the rising rate of anode voltage $dV_A/dt$ increases, instantaneous switching power loss increases when the fall period is long, so that it is impossible to stably turn off the GTO thyristor. On the other hand, where the stray inductance of the Snubber circuit is great, a high surge voltage is generated and therefore the turning-off power loss further increases, so that the turn-off operation often fails, resulting in GTO destruction.

In addition to the above-mentioned conditions, it is possible to improve the controllable anode current and the capability against anode voltage rising rate $dV_A/dt$ by passing as large a gate current as possible from the cathode K to the gates $G_1$ and $G_2$ when the GTO is turned off. This is because the greater the GTO turning-off gate current, the faster will be the large anode current turned off from the standpoint of the turn-off mechanism in the GTO as already described with reference to FIG. 1. Further, the reason why the capability against anode voltage rising rate $dV_A/dt$ is improved by passing a large gate current is that: where the fall period is short, the instantaneous switching power loss can be reduced.

In the prior-art GTO thyristor, however, since the gate voltage is applied to the first and second gates $G_1$ and $G_2$ simultaneously and equally, the anode current usually tends to concentrates near the middle portion of the cathode electrode K during the storage time period as shown in FIGS. 3(a) and 3(b) or at the central portion of the cathode electrode K, in particular, during the fall time period as shown in FIGS. 4(a) and 4(b). Accordingly, there inevitably exist large internal resistances $R_o$ within the second P-type layer $P_2$, thus it being impossible to effectively pass a large gate current whenever the GTO is turned on or, in particular, off.

In view of the above description, reference is now made to embodiments of the GTO according to the present invention with reference to the attached drawings.

The feature of the present invention is to apply two GTO turning-off gate voltages separately with a time delay to the two gate electrodes $G_1$, $G_2$ arranged on both the sides of the cathode electrode K, in order to reduce the internal resistance $R_o$ within the second P-type layer $P_2$ while the GTO thyristor is being turned off.

Figure 5:
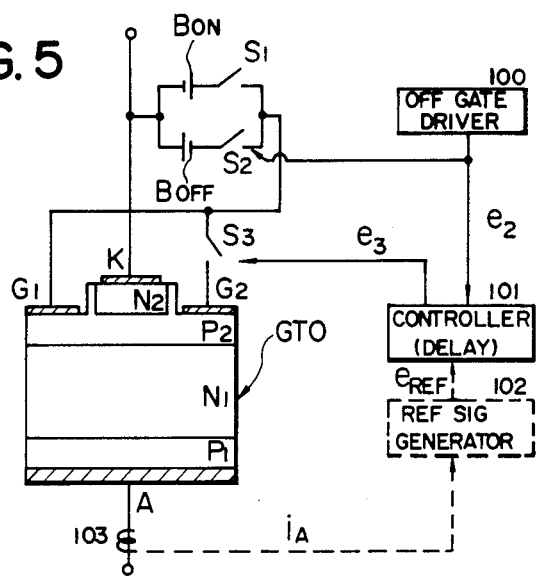
FIG. 5 is a diagrammatic view and block diagram showing a structure and configuration of a GTO thyristor including a thyristor turning on/off gate driving circuit of a first embodiment according to the present invention.

FIG. 5 shows a first embodiment of the GTO thyristor according to the present invention. The GTO thyristor including the gate driving circuit of the present invention is substantially the same in structure and circuit configuration as the prior-art GTO except a third switching element $S_3$ connected to one of the two gate electrodes $G_1$ and $G_2$. The same reference symbols have been retained for similar elements or parts which have the same functions, without making any detailed description of them again.

The switching element $S_3$ is connected between the common terminal of the first and second switches $S_1$ and $S_2$ and the second gate electrode $G_2$. The switch $S_3$ is also a high-speed switching element such as MOSFET (Metal-Oxide Semiconductor Field Effect Transistor). The switch $S_3$ is so designed as to be closed a predetermined time period after the second switch $S_2$ has been closed, that is, after the GTO turning-off gate voltage has been applied to the first gate $G_1$ to turn off the GTO.

Figure 6A:
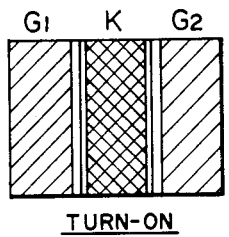
FIGS. 6(a), 6(b)
Figure 7A:
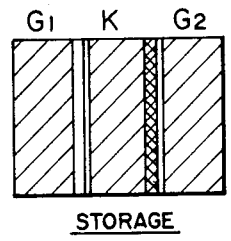
FIGS. 7(a), 7(b), and FIGS. 8(a), 8(b) show illustrations for assistance in explaining changes in anode current paths when the GTO thyristor according to the present invention is turned off.
Figure 8A:
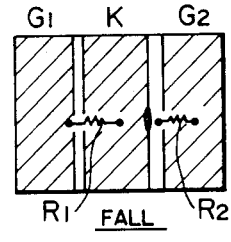

The operations of the GTO of the first embodiment will be desxribed herein below in more detail with reference to FIG. 5, FIGS. 6(a), (b); FIGS. 7(a), (b); FIGS. 8(a), (b); and FIG. 9.

Figure 6B:
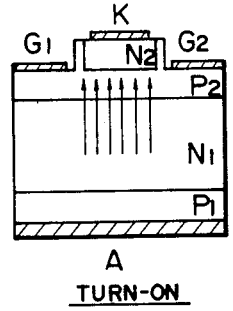
Figure 9:
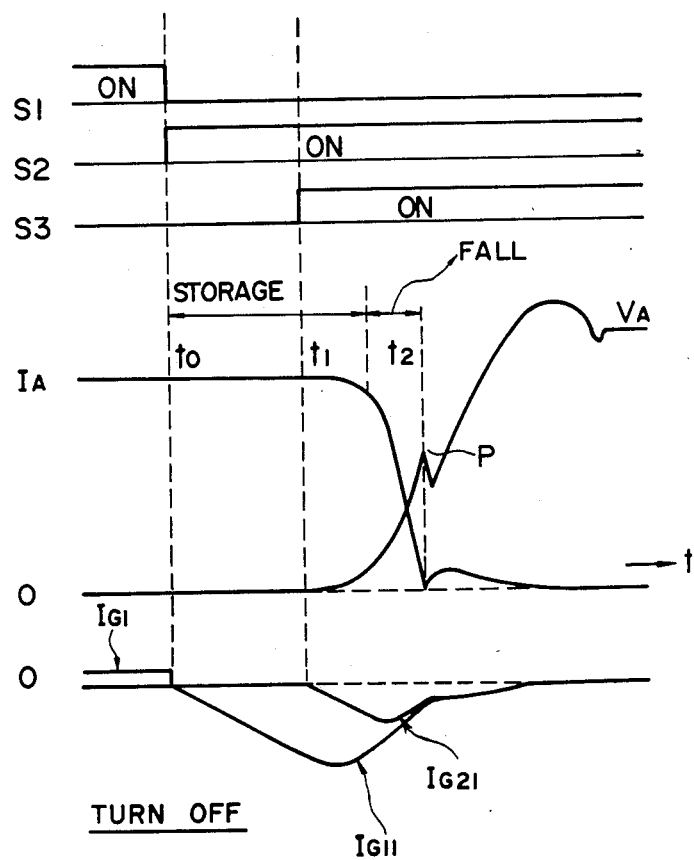
FIG. 9 is a graphical representation showing the waveforms of anode current $I_A$, anode voltage $V_A$, and gate currents $I_{G11}$, $I_{G21}$, etc. in the first embodiment of the GTO thyristor according to the present invention, in which the timings of switches $S_1$, $S_2$ and $S_3$ are also shown.

(1) Turned-on state:

To turn on the GTO, the first switch $S_1$ is closed in the state where a voltage is applied between the anode A and the cathode K (anode: positive, cathode: negative). Therefore, a turn-on gate voltage is applied between the first gate $G_1$ and the cathode K (first gate: positive, cathode: negative). Since turn-on gate current $I_{G1}$ (shown in FIG. 9) flows from the first gate electrode $G_1$ to the cathode K, the GTO is turned on. In this turn-on state, the anode current is $I_A$ as shown in FIG. 9; the anode voltage is substantially zero also as shown in FIG. 9. Further, the anode current $I_A$ distributes in a wide rectangular state throughout the second N-type layer $N_2$ or under the cathode electrode K, as shown in FIGS. 6(a) and 6(b).

Figure 7B:
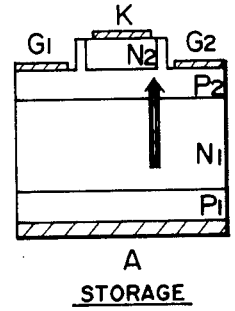

(2) Turn-off storage period:

To turn off the GTO, the first switch $S_1$ is opened and the second switch $S_2$ is closed simultaneously at the time $t_0$ shown in FIG. 9. Since the voltage is reversed; that is, since turning-off gate voltage is applied between the first gate $G_1$ and the cathode K (cathode: positive; first gate: negative), a first turn-off gate current $I_{G11}$ begins to flow from the cathode electrode K to the first gate electrode $G_1$ as shown in FIG. 9. With increasing first gate current $I_{G11}$, the anode current concentrates in a narrow rectangular state within the second N-type layer $N_2$ or under the cathode electrode K as shown in FIGS. 7(a) and 7(b). At the same time, it should be noted that the concentrated anode current $I_A$ shifts from the middle to the second gate electrode $G_2$ side within the semiconductor layer $N_2$ or under the cathode electrode K. This is because the turning-off gate current $I_{G11}$ flows from the cathode electrode K to the first gate electrode $G_1$ in the direction opposite to the flow of the anode current $I_A$ and therefore the anode current density is lower on the first gate electrode $G_1$ side under the cathode electrode K. The storage period is usually defined as the time interval from when the first gate currint $I_{G11}$ begins to flow to when the anode current $I_A$ drops by 10 percent therefrom. During this storage period, for instance, at time $t_1$ in FIG. 9, the third switch $S_3$ is closed. Since the turn-off gate voltage is applied between the second gate electrode $G_2$ and the cathode electrode K (cathode: positive; second gate: negative), a second turning-off gate current $I_{G21}$ begins to flow from the cathode electrode K to the second gate electrode $G_2$ as shown in FIG. 9. With increasing second gate current $I_{G21}$, the anode current $I_A$ further decreases and begins to concentrate simultaneously.

Figure 8B:
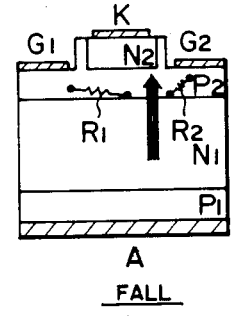

(3) Turn-off fall period:

While the anode current $I_A$ drops to zero the anode current concentrates in a small oval state, as shown in FIGS. 8(a) and 8(b), this period being called fall period. In this fall period, although the anode current $I_A$ concentrates in a small oval state, since the concentrated anode current $I_A$ is located on the second gate $G_2$ side and near the edge of the second N-type $N_2$ layer under the cathode electrode K, the gate resistance $R_2$ between the cathode electrode K and the second gate electrode $G_2$ is reduced markedly as shown in FIGS. 8(a) and 8(b). In other words, it is possible to effectively draw carriers from the second gate electrode $G_2$ to the cathode electrode K, that is, to effectively pass a large gate current therebetween to reduce the fall time period.

In this state, since the second switch $S_2$ is still kept closed, the first gate current $I_{G11}$ is still flowing via the gate resistance $R_1$ between the cathode electrode K and the first gate electrode $G_1$. However, since the resistance $R_2$ is much smaller than the resistance $R_1$, the first gate current $I_{G11}$ decreases as the second gate current $I_{G21}$ increases as shown in FIG. 9. Here, it should be noted that since the gate resistance $R_2$ is small, it is possible to increase the second gate current $I_{G21}$ and therefore to decrease the fall period, so that it is possible to improve the controllable (turning-off) anode current and simultaneously the capability against the anode voltage rising rate $dV_A/dt$ when the GTO is being turned off, because the turn-off power loss is reduced when the fall period is short, even is the anode voltage rising rate increases.

Further, in the anode voltage curve $V_A$ shown in FIG. 9, the sloper of $V_A$ is roughly determined by the capacitance of the Snubber circuit; and the magnitude of peak value P is roughly determined by the stray inductance of the Snubber circuit.

Means for closing the third switch $S_s$ a predetermined time period after the second switch $S_2$ has been closed will be described hereinbelow with reference to FIG. 5. The schematic block diagram shown by solid lines shows a first modification of the first embodiment.

The third switch closing means includes a GTO turning-off gate signal driver 100 and a controller 101. In the first modification, the controller 101 is a time delay unit. Therefore, the second switch $S_2$ is first closed in response to a signal $e_2$ sent from the gate signal driver 100. The time delay unit 101, for instance, begins to count a predetermined time interval by clock signal in response to the signal $e_2$ sent from the gate signal driver 100. When the counted time interval reaches a fixed value, the time delay unit 101 applies a signal $e_3$ to the third switch $S_3$ to close it.

As already described, the storage period changes according to the magnitude of the anode current $I_A$. That is to say, the larger the anode current, the longer the storage period. In this first modification of the first embodiment, the delay time $(t_1-t_0)$ is so determined that the third switch $S_3$ is closed near the end of the storage period or at the start of the fall period only when the anode current $I_A$ is great and therefore the storage period is long. In other words, when the anode current $I_A$ is small and therefore the storage period is short, there may exist the case where the third switch $S_{32}$ is closed after the anode current $I_A$ has completely reached zero. In such a case as described above, however, since the anode current $I_A$ is small, there exist no special problems such that the turning-off operation fails or the GTO is destroyed.

The schematic block diagrma shown by dashed line in FIG. 5 shows a second modification of the first embodiment. The third switch closing means further includes an anode current detector 103 such as a current transformer arranged near a conductor connected to the anode electrode A and a reference signal generator 102. The current transformer 103 can detect the magnitude of the anode current $I_A$ and generates a signal $i_A$ corresponding thereto. The reference signal generator 102 generates a reference signal $e_{REF}$ the voltage level of which is roughly proportional to the signal $i_A$ detected by the current transformer 103. The controller 101 is also a time delay unit which can automatically change the delay time (from the time $t_0$ when a signal $e_2$ is inputted thereto from the gate signal driver 100 to the time $t_1$ when a signal $e_3$ is outputted therefrom) according to the voltage level of the signal $e_{REF}$ from the reference signal generator 102. In more detail, the larger the anode current $I_A$, the longer the delay time between signals $e_2$ and $e_3$. In this second modification of the first embodiment, the delay time $(t_1-t_0)$ is always so determined that the third switch $S_3$ is closed near the end of the storage period or at the start of the fall period freely irrespective of whether the anode current $I_A$ is small or large.

Figure 10:
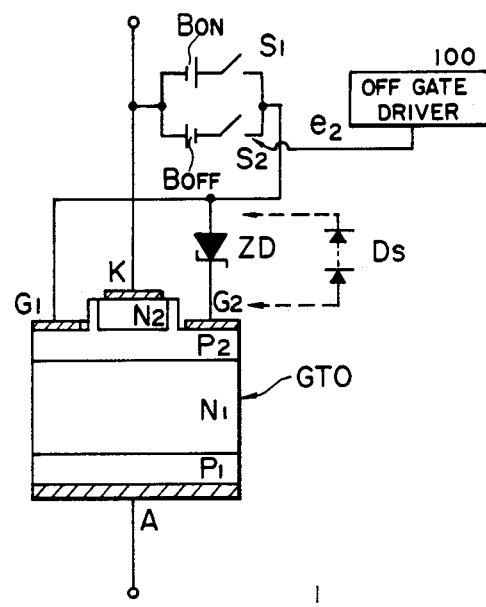
FIG. 10 is a diagrammatic view and a block diagram showing a structure and configuration of a GTO thyristor including a thyristor turning on/off gate driving circuit of a second embodiment of the present invention.

FIG. 10 shows a second embodiment of the GTO thyristor according to the present invention. The GTO thyristor including the gate driving circuit of the present invention is the same in structure and circuit configuration as the first embodiment except a Zener diode ZD serving as the third switching element $S_3$. The same reference symbols have been reatined for similar elements or parts which have the same functions, without making any detailed description of them again.

The Zener diode ZD is cnnected as shown between the first gate electrode $G_1$ and the second gate electrode $G_2$ (positive terminal: $G_1$; negative terminal: $G_2$). The Zener diode ZD is conducted (current flows from $G_2$ to $S_2$) after the second switch $S_2$ has been closed, that is, after the GTO turning-off gate voltage has been applied between the cathode K and the first gate $G_1$ to turn off the GTO.

Figure 11:
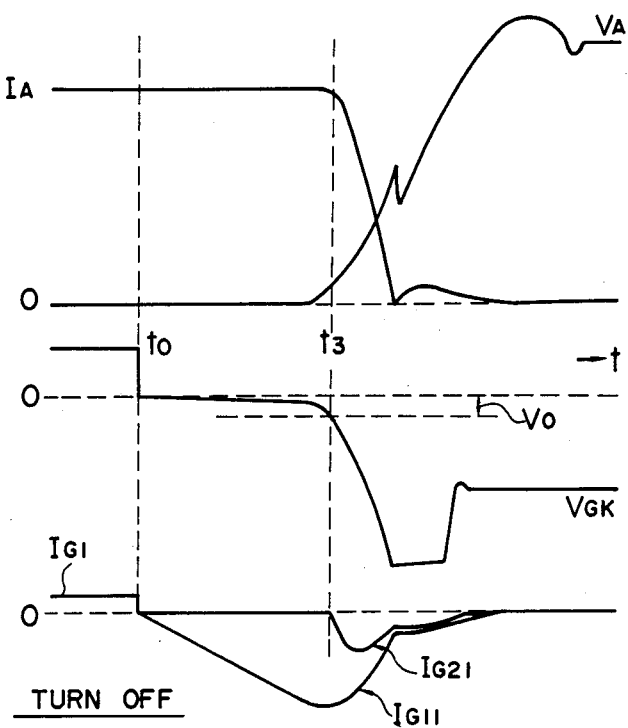
FIG. 11 is a graphical representation showing the waveforms of anode current $I_A$, anode voltage $V_A$, gate currents $I_{G11}$, $I_{G21}$ and gate voltage $V_{GK}$, etc. in the second embodiment of the GTO thyristor according to the present invention.

The operation of the second embodiment will be described in further detail hereinbelow with reference to FIG. 11.

When the first switch $S_1$ is closed, the GTO thyristor is turned on. In this state, a positive voltage is applied between the first gate electrode $G_1$ and the cathode K ($G_1$: positive; K: negative). Therefore, a turning-on gate current $I_{G1}$ flows from the first gate electrode $G_1$ to the cathode K as shown in FIG. 11. When the first switch $S_1$ is opened and the second switch $S_2$ is closed simultaneously to turn off the GTO thyristor, a reverse voltage is applied between the first gate $G_1$ and the cathode K ($G_1$: negative; K: positive). Therefore, the first gate current $I_{G11}$ begins to flow as shown in FIG. 11. Simultaneously, the voltage $V_{GK}$ between the first gate electrode $G_1$ and the cathode electrode K ($G_1$: negative; K: positive) gently decreases as shown. When this voltage $V_{GK}$ reaches a voltage $V_o$ of the breakdown voltage of the Zener diode ZD at time $t_3$, the Zener diode ZD is conducted, so that the second gate current $I_{G21}$ begins to flow from the cathode electrode K to the second gate electrode $G_2$.

After the Zener diode ZD is conducted, the second gate current $I_{G21}$ increases, the anode current $I_A$ decreases and begins to concentrate into a small oval state as shown in FIG. 8(a). During this fall period, since the concentrated anode current $I_A$ is located on the second gate $G_2$ side and near the edge of the second N-type $N_2$ layer under the cathode electrode K, the gate resistance $R_2$ between the cathode electrode K and the second gate electrode $G_2$ is reduced markedly as shown in FIG. 8(b), so that it is possible to increase the second gate current $I_{G21}$ to turn off the GTO thyristor at high speed through which a large anode current $I_A$ is flowing.

In this second embodiment, since the voltage $V_{GK}$ between the second gate electrode $G_2$ and the cathode electrode K is detected to automatically conduct the Zener diode ZD, that is, to automatically pass the second gate current $I_{G21}$ through a low resistance $R_2$ between the gate $G_2$ and the cathode K, there exists an advantage that the timing $t_3$ at which the second gate current $I_{G21}$ begins to flow can automatically be adjusted, even if the magnitude of the anode current $I_A$ varies and therefore the time interval of the storage period changes. Additionally, the above timing $t_3$ can also be changed by selecting an appropriate breakdown voltage $V_o$ of the Zener diode ZD. That is to say, it is possible to freely set the timing $t_3$ near the end of the storage period or to the start of the fall period.

Further, in this second embodiment, it is possible to use series-connected diodes $D_s$ in place of the Zener diode ZD. In this case, the diodes $D_s$ are connected in the reverse direction, that is, the positive terminals thereof are connected to the second gate electrode $G_2$ and the negative terminals thereof are connected to the turning-off gate voltage supply $B_{off}$ through the second switch $S_2$, as shown by the dashed lines in FIG. 10. In the case where diodes $D_s$ are connected in place of the Zener diode ZD, the turning-on gate current $I_{G1}$ flows only from the first gate electrode $G_1$ to the cathode electrode K, the second gate electrode $G_2$ being used for only turning off the GTO thyristor.

Furthermore, in this second embodiment, since a Zener diode ZD is used as means for applying a turning-off gate voltage between the cathode K and the second gate electrode $G_2$ a predetermined time interval after the turning-off gate voltage has been applied between the cathode K and the first gate electrode $G_1$, there exists an advantage such that the gate driving circuit is simple in circuit configuration without use of the controller 101, the reference signal generator 102, the current transformer 103, etc. as shown in FIG. 5.

As described above, in the GTO thyristor according to the present invention, since a GTO turning-off gate voltage is first applied to a first gate electrode $G_1$ and then to a second gate electrode $G_2$ a predetermined time after the gate voltage has been applied to the first gate electrode $G_1$ in order that the concentrated oval anode current $I_A$ is shifted to the edge of the cathode electrode K or near the second gate electrode $G_2$ during the fall period, it is possible to reduce the internal resistance $R_2$ within the second P-type layer $P_2$ or to increase the gate current. Therefore, there exists an actual effect such that it is possible to increase the controllable anode current $I_A$ by approximately 20 percent and the capability against the anode voltage rising rate $dV_A/dt$ by approximately 30 percent, as compared with the conventional GTO thyristors.

It will be understood by those skilled in the art that the foregoing description is in terms of a preferred embodiment of the present invention wherein various changes and modifications may be made without departing from the spirit and scope of the invention, as set forth in the appended claims.

What is claimed is:

1. A gate turn-off thyristor having an anode electrode, a cathode electrode, first and second gate electrodes placed on the opposite sides of said cathode electrode, and a drive circuit for turning said thyristor on to cause an anode current flow through said anode electrode, said drive circuit including means for generating a first electrical signal to said first gate electrode and a second electrical signal to said second gate electrode after a substantial time delay relative to the first electrical signal for tuning said thyristor off to interrupt the anode current flow, said drive circuit means generating the first electrical signal to said first gate electrode to start a storage period and the second electrical signal to said second gate electrode to terminate the storage period a time after the second electrical signal is generated, said time being shorter than the substantial time delay, said drive circuit means including a signal generator for generating the first electrical signal to the first gate electrode, and a delay circuit coupled to said signal generator for converting the first electrical signal to the second electrical signal delayed relative to the first electrical signal.

2. The gate turn-off thyristor as claimed in claim 1, wherein the storage period starts when the first electrical signal is applied to said first gate electrode and terminates when a 10 percent drop occurs in the anode current.

3. The gate turn-off thyristor as claimed in claim 2, wherein said drive circuit means generates the second electrical signal near the termination of the storage period.

4. The gate turn-off thyristor as claimed in claim 1, wherein said drive circuit means generates the second signal after a predetermined time delay relative to the first electrical signal.

5. The gate turn-off thyristor as claimed in calim 1, wherein said delay circuit includes means for sensing the anode current for generating a signal indicative of a sensed anode current level, and means responsive to the anode current level indicative signal for varying the substantial time delay.

6. The gate turn-off thyristor as claimed in calim 5, wherein said delay circuit includes means for increasing the substantial time delay as the sensed anode current level increases.

7. The gate turn-off thyristor as claimed in claim 1, wherein said delay circuit comprises a zener diode having a positive terminal coupled to said signal generator and a negative terminal connected to said second gate electrode.

8. The gate turn-off thyristor as claimed in claim 1, wherein said drive circuit means generates the second electrical signal to said second gate electrode when the anode current drops to zero.

* * * * *